(12) United States Patent
Chhatre et al.

(10) Patent No.: US 9,583,377 B2
(45) Date of Patent: Feb. 28, 2017

(54) INSTALLATION FIXTURE FOR ELASTOMER BANDS

(71) Applicant: Lam Research Corporation, Fremont, CA (US)

(72) Inventors: Rish Chhatre, Danville, CA (US); David Schaefer, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 564 days.

(21) Appl. No.: 14/109,400

(22) Filed: Dec. 17, 2013

(65) Prior Publication Data

US 2015/0170942 A1 Jun. 18, 2015

(51) Int. Cl.
*B23Q 1/70* (2006.01)
*H01L 21/70* (2006.01)
*H01L 21/67* (2006.01)
*H01L 21/687* (2006.01)

(52) U.S. Cl.
CPC ........ *H01L 21/70* (2013.01); *H01L 21/67126* (2013.01); *H01L 21/68785* (2013.01); *Y10T 29/4987* (2015.01); *Y10T 29/53657* (2015.01)

(58) Field of Classification Search
CPC . B25B 27/0028; B25B 27/0092; B25B 27/28; Y10T 29/53657
See application file for complete search history.

(56) References Cited

U.S. PATENT DOCUMENTS

| | | | |
|---|---|---|---|
| 5,636,098 A | 6/1997 | Salfelder et al. | |
| 5,740,009 A | 4/1998 | Pu et al. | |
| 6,073,577 A | 6/2000 | Lilleland et al. | |
| 6,090,304 A | 7/2000 | Zhu et al. | |
| 6,280,304 B1 | 8/2001 | Nakamura et al. | |
| 6,346,038 B1 | 2/2002 | Kajiwara et al. | |
| 6,364,957 B1 | 4/2002 | Schneider et al. | |
| 6,379,230 B1 | 4/2002 | Hayashi et al. | |
| 6,390,894 B1 | 5/2002 | Beel et al. | |
| 6,431,964 B1 | 8/2002 | Ishikawa et al. | |
| 6,435,941 B1 | 8/2002 | White | |
| 6,771,482 B2 | 8/2004 | Kenney | |
| 6,944,006 B2 | 9/2005 | Zheng et al. | |
| 7,274,004 B2 | 9/2007 | Benjamin et al. | |
| 7,431,788 B2 | 10/2008 | Ricci et al. | |
| 7,514,506 B2 | 4/2009 | Mansfield et al. | |
| 7,723,994 B2 | 5/2010 | Kimball et al. | |
| 7,884,925 B2 | 2/2011 | Howard et al. | |
| 7,942,425 B2 | 5/2011 | Shojima | |
| 8,038,796 B2 | 10/2011 | Ricci et al. | |
| 8,677,586 B2 * | 3/2014 | Newton ............ | H01J 37/32495 29/235 |

(Continued)

*Primary Examiner* — Lee D Wilson

(57) ABSTRACT

An installation fixture adapted to mount an elastomer band in a mounting groove around a semiconductor substrate support used for supporting a semiconductor substrate in a plasma processing chamber is disclosed, which includes an annular ring having a vertically extending portion on an outer edge of the ring and adapted to receive the elastomer band, and a base plate configured to be attached to the annular ring, the base plate having a plurality of radially extending portions adapted to receive a plurality of mechanical fasteners at locations corresponding to mounting holes in the semiconductor substrate support.

18 Claims, 5 Drawing Sheets

(56) References Cited

U.S. PATENT DOCUMENTS

| | | | |
|---|---|---|---|
| 8,844,106 B2* | 9/2014 | Chhatre | H01L 21/6719 29/235 |
| 2006/0144516 A1 | 7/2006 | Ricci et al. | |
| 2007/0187038 A1 | 8/2007 | Ren et al. | |
| 2009/0179366 A1 | 7/2009 | Herchen et al. | |
| 2009/0290145 A1 | 11/2009 | Howard et al. | |
| 2010/0044974 A1 | 2/2010 | Kenworthy et al. | |
| 2010/0078899 A1 | 4/2010 | Povolny et al. | |
| 2010/0108261 A1 | 5/2010 | Augustino et al. | |
| 2010/0117309 A1 | 5/2010 | Yudovsky | |
| 2013/0117986 A1* | 5/2013 | Chhatre | H01L 21/6719 29/428 |
| 2015/0170942 A1* | 6/2015 | Chhatre | H01L 21/70 29/450 |

* cited by examiner

INSTALLATION FIXTURE FOR ELASTOMER BANDS

FIELD OF THE INVENTION

The present disclosure relates to an installation fixture for installing an elastomer band around a substrate support and method of using the installation fixture.

BACKGROUND

Integrated semiconductor circuits have become the primary components of most electronics systems. These miniature electronic devices may contain thousands of the transistors and other circuits that make up the memory and logic subsystems of microcomputer central processing units and other integrated circuits. The low cost, high reliability and speed of these circuits have led them to become a ubiquitous feature of modem digital electronics.

The fabrication of integrated semiconductor circuits typically takes place in a reactive ion etching system, such as a parallel plate reactor or inductively coupled plasma reactor. A reactive ion etching system may consist of an etching chamber with an upper electrode or anode and a lower electrode or cathode positioned therein. The cathode is negatively biased with respect to the anode and the container walls. The wafer to be etched is covered by a suitable mask and placed directly on the cathode. A chemically reactive gas such as $CF_4$, $CHF_3$, $CClF_3$, $HBr$, $Cl_2$ and $SF_6$ or mixtures thereof with $O_2$, $N_2$, He or Ar is introduced into the etching chamber and maintained at a pressure which is typically in the millitorr range. The upper electrode is provided with gas hole(s) which permit the gas to be uniformly dispersed through the electrode into the chamber. The electric field established between the anode and the cathode will dissociate the reactive gas forming plasma. The surface of the wafer is etched by chemical interaction with the active ions and by momentum transfer of the ions striking the surface of the wafer. The electric field created by the electrodes will attract the ions to the cathode, causing the ions to strike the surface in a predominantly vertical direction so that the process produces well-defined vertically etched side walls.

Plasmas used for reactive ion etching are highly corrosive species and chamber component surfaces that are exposed to plasmas can degrade quickly. Such degradation of chamber components is costly and can lead to contamination of chamber components or to contamination of a substrate being processed in the chamber. Such degradation requires replacement of contaminated chamber components and/or cleaning of the contaminated chamber components. Such replacement and/or cleaning of the chamber components leads to down-time of the processing chamber.

A substrate support comprising an electrostatic chuck (ESC) for electrostatically clamping a substrate to the support is one such chamber component that may undergo degradation due to exposure to a plasma environment. These types of substrate supports typically comprise a number of components adhered to one another. For example, the support may comprise a cooling plate, a heater element and/or a ceramic plate bonded to one another by a suitable adhesive. To minimize degradation from exposure to the plasma environment, it is common to place an elastomer band around these components in order to protect the adhesive from direct exposure to the plasma environment, such as described in commonly-owned U.S. Patent Publication Nos. 2013/0097840, 2013/0117986 and 2013/0263427. However, the elastomer band is then directly exposed to the plasma environment and suffers degradation therefrom. The elastomer band also suffers degradation from compression forces under operational conditions.

The manner in which an elastomer band is disposed around a substrate support may also yield localized stresses in the elastomer band, which leads to the elastomer band being further susceptible to degradation from exposure to the plasma environment. Typically, an elastomer band is disposed around a substrate support by hand in a 5-point star-shaped pattern. Such a disposal pattern creates highly localized stress areas in the elastomer, which are weaker areas in the elastomer and subjects these areas to greater mass loss when exposed to a plasma environment, usually leading to cracking of the elastomer.

Thus, there is a need for an improved method of installing an elastomer band around a substrate support such that the elastomer band demonstrates increased resistance to degradation from exposure to a plasma environment.

SUMMARY

An installation fixture adapted to mount an elastomer band in a mounting groove around a semiconductor substrate support used for supporting a semiconductor substrate in a plasma processing chamber is disclosed, the installation fixture comprising: an annular ring having a vertically extending portion on an outer edge of the ring and adapted to receive the elastomer band; and a base plate configured to be attached to the annular ring, the base plate having a plurality of radially extending portions adapted to receive a plurality of mechanical fasteners at locations corresponding to mounting holes in the semiconductor substrate support.

An elastomer band installation kit is disclosed, the kit comprising: an installation fixture adapted to mount an elastomer band in a mounting groove around a semiconductor substrate support used for supporting a semiconductor substrate in a plasma processing chamber, the installation fixture comprising: an annular ring having a vertically extending portion on an outer edge of the ring and adapted to receive the elastomer band; and a base plate configured to be attached to the annular ring, the base plate having a plurality of radially extending portions adapted to receive a plurality of mechanical fasteners at locations corresponding to mounting holes in the semiconductor substrate support; and a plurality of mechanical fasteners each adapted to fit through through-holes of a substrate support and through the through-holes of the installation fixture.

A method of installing an elastomer band as a protective edge seal around a portion of a semiconductor substrate support used for supporting a semiconductor substrate in a plasma processing chamber is disclosed, the method comprising: disposing an elastomer band around a vertically extending portion of an installation fixture, the installation fixture comprising: an annular ring having a vertically extending portion on an outer edge of the ring and adapted to receive the elastomer band; and a base plate configured to be attached to the annular ring, the base plate having a plurality of radially extending portions adapted to receive a plurality of mechanical fasteners at locations corresponding to mounting holes in the semiconductor substrate support; and sliding the elastomer band off the vertically extending portion of the installation fixture and into a mounting groove in the substrate support adapted to receive the elastomer band.

DETAILED DESCRIPTION

Substrate supports for reactive ion etch processing chambers typically include a lower electrode assembly comprising an electrostatic clamping layer on which a substrate or wafer is clamped during processing in a plasma processing chamber. The lower electrode assembly can also include various layers bonded to a temperature controlled base plate. For example, the assembly can include an upper ceramic layer incorporating one or more electrostatic electrodes adhesively bonded to an upper side of a heater plate, one or more heaters adhesively bonded to a bottom of the heater plate, and a temperature controlled base plate (hereafter referred to as cooling plate) adhesively bonded to the heaters and heater plate. To protect the plasma-exposed adhesive bond layers, an edge seal, for example, an elastomer band can be disposed around the bond layers of the substrate support.

Figure 1:
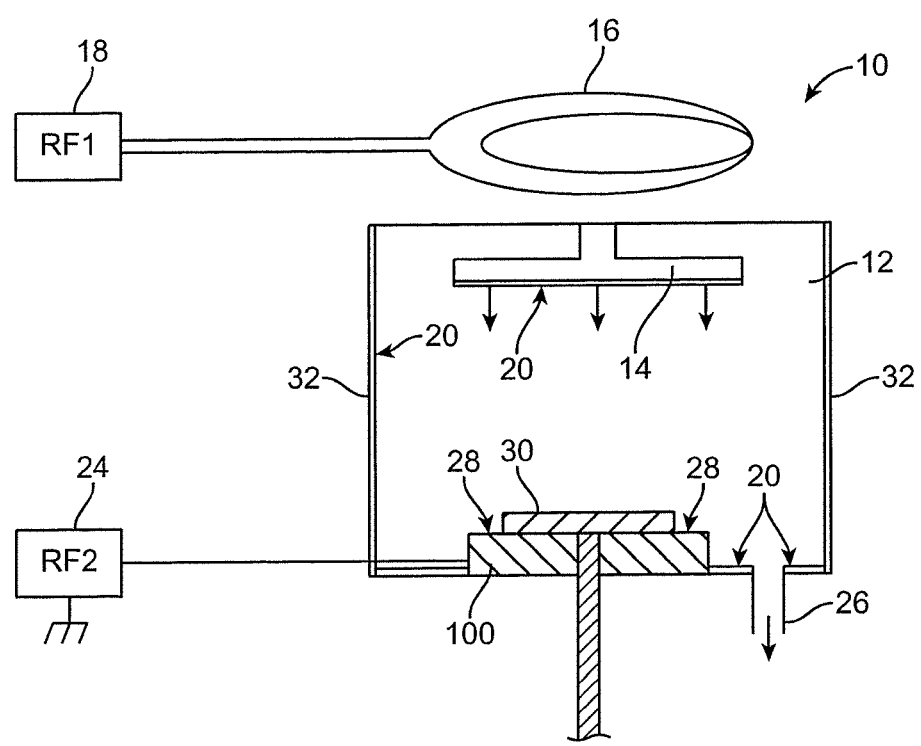
FIG. 1 shows a cross-sectional view of a processing chamber suitable for plasma etching semiconductor substrates.

FIG. 1 shows a cross-sectional view of an exemplary plasma reactor 10 for etching substrates. As shown in FIG. 1, the plasma reactor 10 includes a plasma processing chamber 12, an antenna disposed above the chamber 12 to generate plasma, which is implemented by a planar coil 16. The RF coil 16 is typically energized by an RF generator 18 via a matching network (not shown). Such chambers are called inductively coupled plasma (ICP) chambers. To supply process gas to the interior of the chamber 12, there is provided a gas distribution plate or showerhead 14, which preferably includes a plurality of holes for releasing gaseous source materials, for example, the etchant source gases, into the RF-induced plasma region between the showerhead 14 and a semiconductor substrate or wafer 30 supported on a substrate support 100 comprising lower electrode assembly 28. While an inductively coupled plasma reactor is shown in FIG. 1, the plasma reactor 10 can incorporate other plasma generating sources such as capacitive coupled plasma (CCP), microwave, magnetron, helicon, or other suitable plasma generating equipment, in which case the antenna is omitted.

The gaseous source materials may also be introduced into the chamber 12 by other arrangements such as one or more gas injectors extending through the top wall and/or gas ejection ports built into the walls of chamber 12. Etchant source chemicals include, for example, halogens such as $Cl_2$ and $BCl_3$ when etching through aluminum or one of its alloys. Other etchant chemicals (for example, $CH_4$, HBr, HCl, $CHCl_3$) as well as polymer forming species such as hydrocarbons, fluorocarbons, and hydro-fluorocarbons for side-wall passivation of etched features may also be used. These gases may be employed along with optional inert and/or nonreactive gases.

In use, a wafer 30 is introduced into chamber 12 defined by chamber walls 32 and disposed on the lower electrode assembly 28. The wafer 30 is preferably biased by a radio frequency generator 24 (also typically via a matching network). The wafer 30 can comprise a plurality of integrated circuits (ICs) fabricated thereon. The ICs, for example, can include logic devices such as PLAs, FPGAs and ASICs or memory devices such as random access memories (RAMs), dynamic RAMs (DRAMs), synchronous DRAMs (SDRAMs), or read only memories (ROMs). When the RF power is applied, reactive species (formed from the source gas) etch exposed surfaces of the wafer 30. The by-products, which may be volatile, are then exhausted through an exit port 26. After processing is complete, the wafer 30 can be subjected to further processing and eventually diced to separate the ICs into individual chips.

It can be appreciated that the reactor 10 can also be used for metal, dielectric and other etch processes. In plasma etch processing, the gas distribution plate can be a circular plate situated directly below a dielectric window in an ICP reactor or form part of an upper electrode assembly in a CCP reactor called a parallel plate reactor wherein the gas distribution plate is a showerhead electrode oriented parallel to a semiconductor substrate or wafer 30. The gas distribution plate/showerhead electrode contains an array of holes of a specified diameter and spatial distribution to optimize etch uniformity of the layers to be etched, for example, a photoresist layer, a silicon dioxide layer and an underlayer material on the wafer.

An exemplary parallel-plate plasma reactor that can be used is a dual-frequency plasma etch reactor (see, for example, commonly-owned U.S. Pat. No. 6,090,304, which is hereby incorporated by reference in its entirety). In such reactors, etching gas can be supplied to a showerhead electrode from a gas supply and plasma can be generated in the reactor by supplying RF energy at different frequencies from two RF sources to the showerhead electrode and/or a bottom electrode. Alternatively, the showerhead electrode can be electrically grounded and RF energy at two different frequencies can be supplied to the bottom electrode.

Figure 2:
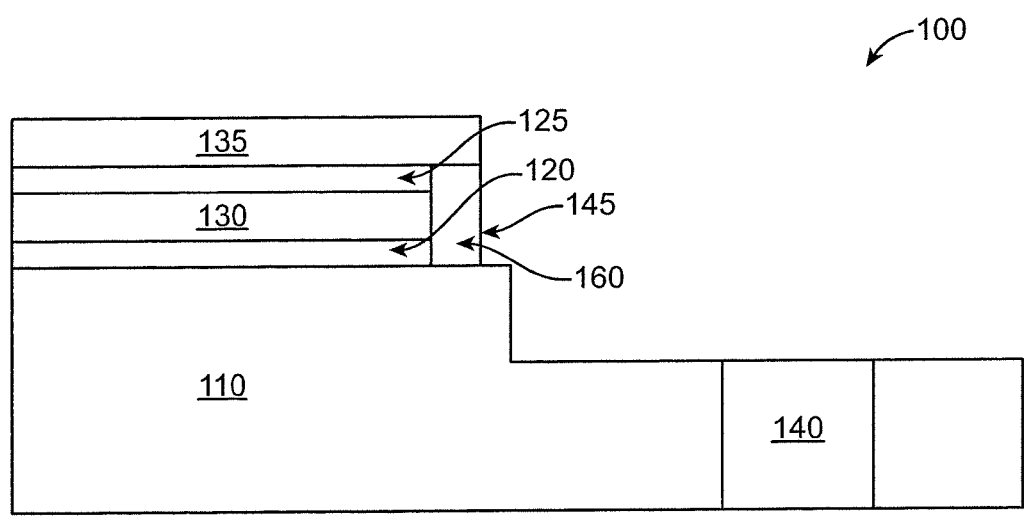
FIG. 2 shows a cross-sectional view of a substrate support having an elastomer band within a mounting groove.

FIG. 2 shows a cross-sectional view of a portion of substrate support 100 having various layers bonded together with exposed bond layers located in a mounting groove adapted to receive an edge seal, for example, an elastomeric band 160. The substrate support 100 may also be adapted to receive a plurality of mechanical fasteners. The substrate support 100 comprises a heater plate 130 comprised of a metal or ceramic. An adhesive bonding layer 120 is disposed below the heater plate 130 and bonds the heater plate 130 to the cooling plate 110. Another adhesive bonding layer 125 is disposed above the heater plate 130 and bonds the heater plate 130 to the ceramic plate 135 incorporating one or more electrostatic clamping electrodes. The ceramic plate 135 and the cooling plate 110 may have portions that extend beyond the outermost portions of the heater plate 130 and the bonding layers 120, 125 to form a mounting groove 145. The outermost portions of the heater plate 140 and the bond layers 120, 125 are substantially aligned with respect to one another. Preferably, the ceramic plate 135 has a larger diameter than the heater plate 130 and the bonding layers 120, 125.

In an exemplary embodiment, the cooling plate 110 can be configured to provide temperature control by the inclusion of fluid channels (not shown) therein through which a temperature controlled liquid can be circulated. The cooling plate 110 is typically a metal base plate which functions as the lower RF electrode in the plasma chamber. The cooling plate 110 preferably comprises an anodized aluminum or aluminum alloy. However, it can be appreciated that any suitable material, including metallic, ceramic, electrically conductive and dielectric materials can be used. In an exemplary embodiment, the cooling plate 110 is formed from an anodized machined aluminum block. Alternatively, the cooling plate 110 could be of ceramic material with one or more electrodes located therein and/or on an upper surface thereof. In addition, the cooling plate 110 preferably has a uniform thickness from the center to the outer edge or diameter thereof and is preferably a thin circular plate. The cooling plate 110 may comprise a series of though-holes 140 for receiving mechanical fasteners which fasten substrate support 100 to the processing chamber.

The heater plate 130 may be in the form of a metal or ceramic plate with at least one film heater coupled to a bottom of the metal or ceramic plate. The film heater can be a foil laminate (not shown), which includes a first insulation layer (e.g., dielectric layer), a resistive heating layer (e.g., one or more strips of electrically resistive material) and a second insulation layer (e.g., dielectric layer). The insulation layers preferably consist of materials having the ability to maintain its physical, electrical and mechanical properties over a wide temperature range including resistance to corrosive gases in a plasma environment such as Kapton or other suitable polyimide films. The resistive heating layer preferably consists of a high strength alloy such as Inconel or other suitable alloy or anti-corrosion and resistive heating materials. The film heater can be in the form of a laminate of Kapton, Inconel and Kapton having a total thickness of about 0.005 to about 0.009 of an inch and more preferably about 0.007 of an inch thick.

The ceramic layer 135 is preferably an electrostatic clamping layer of ceramic material with an embedded electrode comprised of a metallic material, such as W, Mo etc. In addition, the ceramic layer 135 preferably has a uniform thickness from the center to the outer edge or diameter thereof and is preferably a thin circular plate suitable for supporting 200 mm, 300 mm or 450 mm diameter wafers. Details of a lower electrode assembly having an upper electrostatic clamping layer, heater layer and bonding layers are disclosed in commonly owned U.S. Pat. No. 8,038,796 wherein the upper electrostatic clamping layer has a thickness of about 0.04 inch, the upper bonding layer has a thickness of about 0.004 inch, the heater plate comprises a metal or ceramic plate of about 0.04 inch thickness and a heater film of about 0.01 inch thickness, and the lower bonding layer has a thickness of about 0.013 to 0.04 inch. However, different thicknesses of the clamping layer, bond layers and heater layer can be selected to achieve desired process results.

The adhesive bonding layers 120 and 125 are preferably formed from a low modulus material such as an elastomeric silicone or silicone rubber material. However, any suitable bonding material can be used. It can be appreciated that the thickness of adhesive layers 120 and 125 can vary depending on the desired heat transfer coefficient. Thus, the thickness thereof can be uniform or non-uniform to provide a desired heat transfer coefficient based on manufacturing tolerances of the adhesive bonding layers 120 and 125. The thickness of adhesive bonding layers 120 and 125 can vary over its applied area by plus or minus a specified variable. Preferably, if the bond layer thickness does not vary by more than 1.5 percent, the heat transfer coefficient between components of the substrate support 100 can be made substantially uniform. For example, for a substrate support 100, which includes an electrode assembly used in the semiconductor industry, the adhesive bonding layers 120 and 125 preferably have a chemical structure that can withstand a wide range of temperatures. Thus, it can be appreciated that the low modulus material can comprise any suitable material, or combination of materials, such as a polymeric material compatible with a vacuum environment and resistant to thermal degradation at high temperatures (e.g., up to 500° C.). In one embodiment, the adhesive bonding layers 120 and 125 may comprise silicone and be between about 0.001 to about 0.050 of an inch thick and more preferably about 0.003 to about 0.030 of an inch thick.

As shown in FIG. 2, a portion of the cooling plate 110 and the ceramic plate 135 can extend beyond an outermost portion of the heater plate 130, the adhesive bond layers 120 and 125, thereby forming a mounting groove 145 in the substrate support 100. The material(s) of adhesive bonding layers 120 and 125 are typically not resistant to the reactive etching chemistry of semi-conductor plasma processing reactors and therefore, should be protected to accomplish a useful operation lifetime. To protect the adhesive bonding layers 120 and 125, it has been proposed to place an edge seal in the form of an elastomeric band 160, into the mounting groove 145 to form a tight seal that prevents penetration of the corrosive gases of semi-conductor plasma processing reactors. See, for example, commonly owned U.S. Published Application Nos. 2013/0097840, 2013/0117986 and 2013/0263427.

The elastomer band 160 can be installed by hand in a 5-point star-shaped stretching pattern. Generally, a portion of the elastomer band 160 is inserted into a mounting groove and another portion of the elastomer band 160 is stretched and inserted into the mounting groove 145. This stretching process is repeated with subsequent portions of the elastomer band 160 that are away from the previously inserted portion until the elastomer band 160 is completely inserted into the mounting groove 145. However, such a method of inserting the elastomer band 160 leads to highly localized stressed areas in the elastomer band 160. These stressed areas are weaker than other areas in the elastomer band 160 and are subject to greater mass loss when exposed to a plasma environment. The greater mass loss, in turn, leads to degradation, such as cracking, of the elastomer band 160, thereby necessitating replacement of the elastomer band 160.

Figure 3:
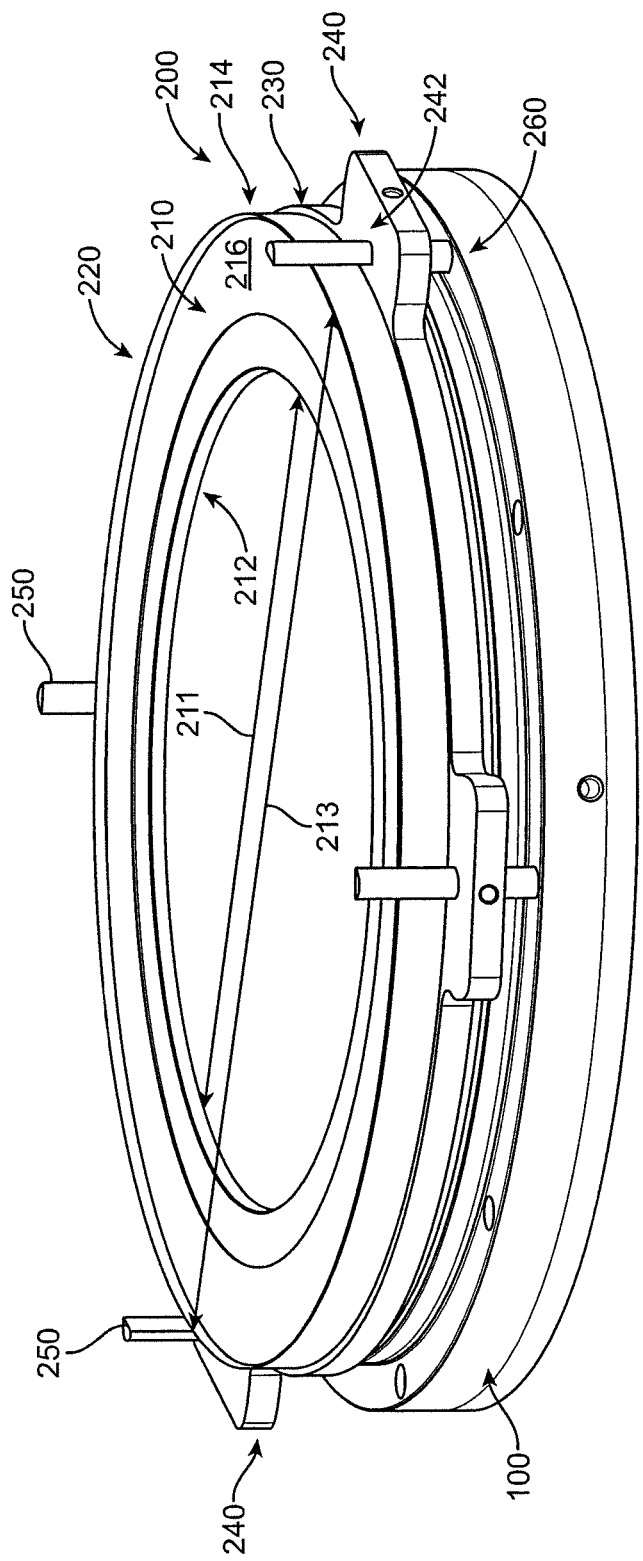
FIG. 3 shows a perspective view of an elastomer band installation fixture on a semiconductor substrate support in accordance with an exemplary embodiment.
Figure 4:
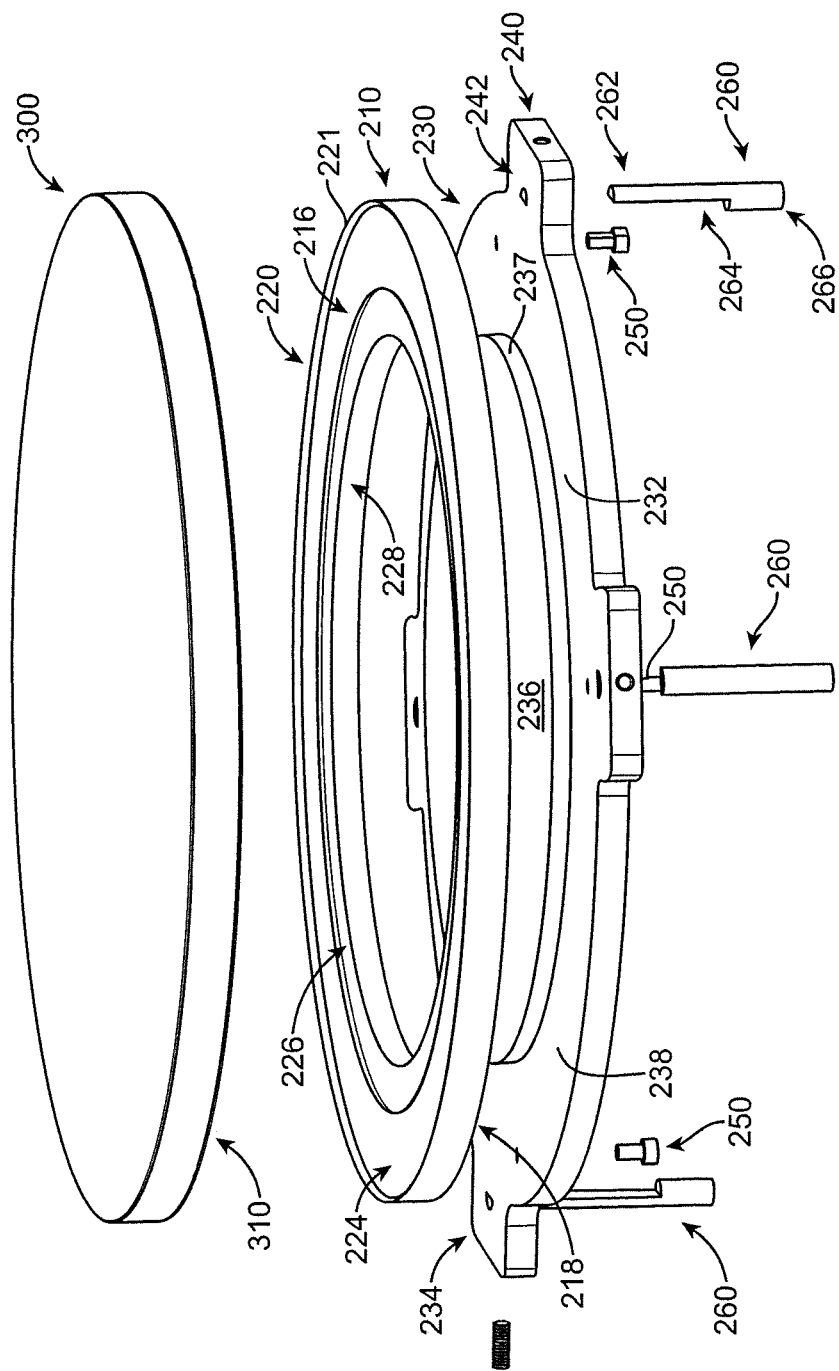
FIG. 4 shows a perspective view of the elastomer band installation fixture in accordance with an exemplary embodiment.

FIG. 3 shows an installation fixture 200 that can be used to relieve such stressed areas of an elastomer band 160 positioned on a semiconductor substrate support 100. As shown in FIG. 3, the installation fixture 200 can include an annular ring 210 having an inner edge 212, an outer edge 214, an upper surface 216, and a lower surface 218 (FIG. 4). In accordance with an exemplary embodiment, the annular ring 210 can also include a vertically extending portion 220 on the outer edge 214 of the annular ring 210 and adapted to receive an elastomer band 160.

The installation fixture 200 can also include a base plate 230 having an outer recess 232 (FIG. 4) configured to be attached to the annular ring 210. The base plate 230 can also include a plurality of radially extending portions 240 adapted to receive a plurality of mechanical fasteners 260 at locations corresponding to mounting holes 140 in the semiconductor substrate support 100. In accordance with an exemplary embodiment, the base plate 230 preferably has an upper surface 234 having an upper inner surface 236, an outer recess 232 (FIG. 4), which is formed by a vertical wall 237 connecting the inner surface 236 to a lower outer surface 238. The lower outer surface 238 is relatively planar. In accordance with an exemplary embodiment, the base plate 230 preferably is a solid stepped plate.

In accordance with an exemplary embodiment, the base plate 230 also includes an inner recess 239 (FIG. 6) having a circular outer diameter formed on a lower surface 233 of the base plate 230. The lower surface 233 of the base plate 230 can include an annular outer surface 235, a vertical wall 241 extending upward to a lower inner surface 243. The recess 239 is adapted to be located above an outer portion or periphery of an upper surface of substrate support 100. For example, in accordance with an exemplary embodiment, the outer annular surface 235 of the base plate 230 can be adapted to be received on and contact the ceramic layer 135 at an outer portion or periphery thereof. In accordance with an exemplary embodiment, the depth of the recess 239 is not particularly limited, so long as a sufficient spacing is provided between the lower inner surface 243 disposed closest to the surface of the ceramic layer 135. For example, the recess 239 can have a depth between about 0.01-0.05 inch, for example, a depth of about 0.025 inch. The base plate 230, for example, can have a thickness between the upper inner surface 236 and the lower inner surface 243 of about 0.50 to 0.60 inches, for example, about 0.524 inches.

In accordance with an exemplary embodiment, the installation fixture 200 preferably has an annular shape thereto and adapted to mount an elastomer band 160 in a mounting groove 145 around a semiconductor substrate support 100. For example, in accordance with an exemplary embodiment, using the installation fixture 200 to install an elastomer band 160 around the substrate support 100 can reduce local stresses in the elastomer band 160 and reduce the chances of the elastomer band 160 cracking under operational conditions, for example, when exposed to a plasma environment. In addition, the use of the installation fixture 200 can lead to an elastomer band 160 with a longer operational lifetime when compared to those installed by hand in a 5-point star-shaped stretching pattern. In addition, a two-piece design as disclosed herein can provide a replaceable annular ring 210, which can be size dependent on the outer diameter of the semiconductor substrate support 100. In addition, a single base plate 230 can be used for the different sized annular rings 210. For example, in accordance with an exemplary embodiment, the annular ring 210 can be replaced after a certain number of uses and/or if damaged during use or transport. The installation fixture 200 as disclosed herein can also provide for improved alignment of the elastomer band 160 around the semiconductor substrate support 100, which can provide improved performance of the plasma reactor 10.

In accordance with an exemplary embodiment, each of the plurality of radially extending portions 240 can include a through-hole 242. In accordance with an exemplary embodiment, the radially extending portions 240 are adapted to receive a plurality of mechanical fasteners 260 at locations corresponding to mounting holes in the semiconductor substrate support 100. Preferably, the base plate 230 of the installation fixture 200 comprises four radially extending portions 240. The spacing of each radially extending portion 240 around the installation fixture 200 is not particularly limited, for example, each radially extending portion 240 can be disposed from about 45° to about 135° from neighboring radially extending portions 240. Alternatively, for example, each radially extending portion 240 can be disposed about 90° from neighboring radially extending portions 240.

The inner 211 and outer diameter 213 of the annular ring 210 of the installation fixture 200 are not particularly limited, so long as installation fixture 200 is sized accordingly with respect to the size of the substrate support 100. For example, the annular ring 210 can have an outer diameter 213 with respect to an outermost surface of the vertically extending portion 220 of between about 11.0 to 12.0 inches with respect a substrate support designed for processing substrates or wafers with a 300 mm diameter. Preferably, the outer diameter 213 is about 11.7 inches. With respect to processing substrates or wafers with a diameter less than 300 mm, such as 200 mm, or greater than 300 mm, such as 450 mm, the diameters of installation fixture 200 are scaled accordingly. The outer diameter 213 of the annular ring 210 can also be determined by the diameter of elastomer band 160 (not shown) and the band's stretching tolerance.

FIG. 4 shows another perspective of the installation fixture 200, which includes the annular ring 210 and the base plate 230, and a protective cover 300. As shown in FIG. 4, the annular ring 210 has an annular recess 226 on an inner portion 228 of the upper surface 216 of the annular ring 210. The annular recess 226 is adapted to be located above an outer portion or periphery of an upper surface of substrate support 100. For example, the upper surface 216 of the annular ring 210 can be adapted to be received on and contact the ceramic layer 135 at an outer portion or periphery thereof. In accordance with an exemplary embodiment, the un-recessed portions 224 of the upper surface 216 can contact an outer periphery of ceramic layer 135. In accordance with an exemplary embodiment, the depth of the recess 226 is not particularly limited, so long as a sufficient spacing is provided between a horizontal surface of the inner portion 228 disposed closest to the outermost surface of ceramic layer 135. For example, the recess 226 can have a depth between about 0.01-0.05 inch, for example, a depth of about 0.025 inch.

In accordance with an exemplary embodiment, the vertical extending portion 220 may comprise an angled tip (not shown) at a free end 221 thereof. Preferably, the angle of the angled tip is between about 10° and about 45° and most preferably about 20°. The through-holes 242 of the radially extending portion 240 of the base plate 230 are adapted to align with though-holes 140 of cooling plate 110.

In accordance with an exemplary embodiment, a protective cover 300 can be provided with the installation fixture 200 to protect the vertical extending portion 220 (or lip) of the annular ring 210, for example, during non-use and/or transport of the fixture 200. The protective cover 300 preferably has a recessed portion 310 configured to fit around and over the vertical extending portion 220 and the outer edge 214 of the annular ring 210. In addition, the recessed portion 310 can be configured to contact the upper surface 216 of the annular ring 210.

As shown in FIG. 4, a mechanical fastener 260 can be used for rotationally constraining installation fixture 200 with respect to substrate support 100. The mechanical fastener 260 can be a locking pin or bolt adapted to fit through both the through-holes 140 of the substrate support 100 and the through-holes 242 of installation fixture 200. In accordance with an exemplary embodiment, the mechanical fastener 260 can be cylindrical or hemi-cylindrical in shape. The mechanical fastener 260 can include a plurality of portions along its length that have varying diameters. For example, one end portion 266 of mechanical fastener 260 may comprise the largest diameter, one end portion 262 of mechanical fastener 260 may comprise the smallest diameter and a central portion 264 may comprise an intermediate diameter. However, the mechanical fastener 260 can be shaped other than cylindrical, such as square, tapered or polygonal. Preferably, end surfaces of the mechanical fastener 260 are recessed and adapted to receive the head of a bolt that fastens the substrate support 100 to a work-piece, such as a table or chamber wall. For example, if the bolts that fasten substrate support 100 to the work-piece are dome-shaped, then end surfaces of mechanical fastener 260 can be recessed with a similar dome-shape or similar concavity. If the bolts that fasten substrate support 100 to the work-piece are hexagonally-shaped, then the end surfaces of the mechanical fastener 260 can be recessed with a similar hexagonal shape.

When the through-holes 140, 242 are aligned, a mechanical fastener 260 can be inserted through each set of aligned through-holes 140, 242 such that installation fixture 200 is rotationally constrained with respect to substrate support 100. The dimensions of mechanical fastener 260 are not particularly limited, so long as it can sufficiently rotationally constrain installation fixture 200 when installed.

Figure 5:
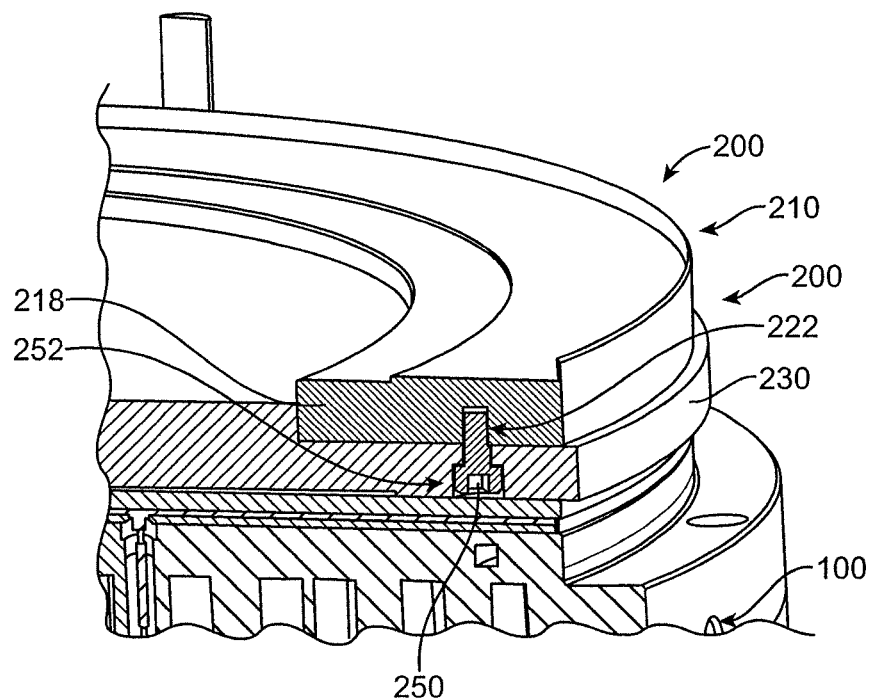
FIG. 5 shows a cross-sectional view of the elastomer band installation fixture in accordance with an exemplary embodiment.

FIG. 5 shows a cross-sectional view of the elastomer band installation fixture 200 in accordance with an exemplary embodiment. As shown in FIG. 5, the base plate 230 can include a plurality of holes 252 configured to receive a screw (or fastener) 250, which attaches the base plate 230 to the annular ring 210 via a corresponding recess 222 on the lower surface 218 of the annular ring 210. For example, in accordance with an exemplary embodiment, the base plate 230 can include three or more equally spaced holes 252 aligned with corresponding recesses 222 on the lower surface 218 of the annular ring 210. The spacing of each of the holes 252 around the base plate 230 is not particularly limited and preferably, for example, each hole 252 can be disposed about 120° from the neighboring hole 252 with corresponding aligned recess 222 in the lower surface of the annular ring 210. In accordance with an exemplary embodiment, the fastener 250 is made from polyetheretherketone (PEEK).

Figure 6:
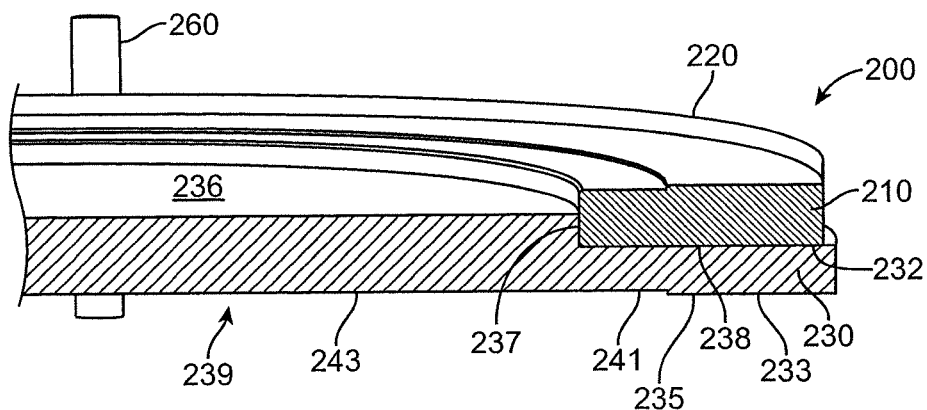
FIG. 6 shows a cross-sectional view of the elastomer band installation fixture in accordance with an exemplary embodiment.

FIG. 6 shows a cross-sectional view of the elastomer band installation fixture 200 in accordance with an exemplary embodiment. In accordance with an exemplary embodiment, the annular ring 210 is configured to fit around an outer vertical wall 237, which connects the upper surface 236 of the base plate 230 to the outer lower surface 238 of the base plate 230 and on top of the outer recess 232 of the base plate 230. As shown in FIG. 6, the base plate 230 also includes an inner recess 239 formed on the lower surface 233 of the base plate 230.

In accordance with an exemplary embodiment, the annular ring 210 and the base plate 230 of installation fixture 200 can each be made from a low-friction plastic material such as polyethylene terephthalate (PET) or a fluorocarbon, for example, TEFLON® (PTFE or polytetrafluoroethylene, manufactured by DuPont). Alternatively, the annular ring 210 and the base plate 230 of the installation fixture 200 can be made from other materials, such as quartz, ceramic, metal or silicon. Methods of making installation fixture 200 are not particularly limited. For example, the annular ring 210 and the base plate 230 of the installation fixture 200 can be machined from a block or annular piece of starting material. Alternatively, the annular ring 210 and the base plate 230 of the installation fixture 200 can be injection molded. In accordance with an exemplary embodiment, the annular ring 210 is made of PTFE or Teflon (Polytetrafluoroethylene) and the base plate 230 is made of polyethylene terephthalate (PET).

In use, the end portion with the largest diameter of each mechanical fastener 260 can be secured into each through-hole 140 of cooling plate 110. Next, the installation fixture 200 can be located over the ceramic layer 135 of the substrate support 100 such that each radially extending portion 240 with through-holes 242 is aligned with each mechanical fastener 260 placed into each through-hole 140 of cooling plate 110 and un-recessed portion 224 of the inner portion 228 contacts an outer periphery of ceramic layer 135. The installation fixture 200 can then be disposed over the ceramic layer 135 with the free end 221 of the vertically extending portion 220 facing away from ceramic layer 135, such that the through-holes 242 of installation fixture 200 are disposed around the central portions 264 of the mechanical fasteners 260. The installation fixture 200 can be rotationally constrained with respect to substrate support 100.

In accordance with an exemplary embodiment, an elastomer band 160 can be placed around an outermost circumference of vertically extending portion 220 by stretching the elastomer band 160 to fit the circumference. Preferably, elastomer band 160 is not stretched more than 2% of its circumference when placed around an outermost circumference of the vertically extending portion 220, as doing so may permanently distort its elasticity. The elastomer band 160 may be relieved of its localized internal stresses by rotation back and forth around installation fixture 200. The elastomer band 160 may be rotated back and forth around installation fixture 200 by at least about 20°. The elastomer band 160 can be rotated back and forth around installation fixture 200 by at least about 20°-90° and more preferably, by at least about 180°. For example, the rotation back and forth is carried out at least twice, and more preferably, at least 4-5 times.

After the elastomer band 160 has been rotated back and forth and its localized internal stresses relieved, installation fixture 200 and the mechanical fasteners 260 are inverted 180° about the horizontal plane of installation fixture 200 and re-secured to substrate support 100. The installation fixture 200 and the mechanical fasteners 260 can be flipped upside down such that the free end 221 is downward facing and proximate mounting groove 145. The un-recessed portions of inner portion 228 contact an upper surface of an outer periphery of ceramic layer 135. The elastomer band 160 is then slid off of vertically extending portion 220 of installation fixture 200 and into mounting groove 145.

After the elastomer band 160 has been placed into mounting groove 145, it may be required to press elastomer band 160 further into mounting groove 145. It is noted that the method described above installs elastomer band 160 around a substrate support 100 while the substrate support is disposed either inside or outside a processing chamber. Due to ease of installation, it is preferable to install elastomer band 160 around substrate support 100 while substrate support 100 is disposed outside of a processing chamber. For example, when outside of a processing chamber, substrate support 100 may be mechanically fastened to a work-piece, such as a table, for installation of elastomer band 160. When inside of a processing chamber, substrate support 100 may also be mechanically fastened to a work-piece, such as a chamber wall, for installation of elastomer band 160.

The elastomer band 160 can be constructed from any suitable semiconductor processing compatible material. For example, the elastomer band 160 is preferably constructed of curable fluoroelastomeric fluoropolymers (FKM) capable of being cured to form a fluoroelastomer or curable perfluoroelastomeric perfluoropolymers (FFKM) can be used. The elastomer band 160 is preferably comprised of a material having high chemical resistance, low and high temperature capability, resistance to plasma erosion in a plasma reactor, low friction, and electrical and thermal insulation properties. A preferred material is a perfluoroelastomer having a Shore A durometer hardness including, but not limited to, 60 to 85 and a specific gravity including, but not limited to 1.9 to 2.1 such as PERLAST available from Perlast Ltd. Another band material is KALREZ available form DuPont Performance Elastomers. PERLAST and KALREZ are FFKM elastomers. The shape of the elastomer band 160 is also not particularly limited and the elastomer bands may be circular, square or rectangular in cross-section. The elastomer bands 160 may also have an irregularly shaped cross-section, such as rectangular cross-section with a concave outer surface as disclosed in commonly owned U.S. Application Patent Publication No. 2013/0097840.

When the word "about" is used in this specification in connection with a numerical value, it is intended that the associated numerical value include a tolerance of ±10% around the stated numerical value.

Moreover, when the words "generally", "relatively", and "substantially" are used in connection with geometric shapes, it is intended that precision of the geometric shape is not required but that latitude for the shape is within the scope of the disclosure. When used with geometric terms, the words "generally", "relatively", and "substantially" are intended to encompass not only features which meet the strict definitions but also features which fairly approximate the strict definitions.

Although the present invention has been described in connection with preferred embodiments thereof, it will be appreciated by those skilled in the art that additions, deletions, modifications, and substitutions not specifically described can be made without departing from the spirit and scope of the invention as defined in the appended claims.

What is claimed is:

1. An installation fixture adapted to mount an elastomer band in a mounting groove around a semiconductor substrate support used for supporting a semiconductor substrate in a plasma processing chamber, the installation fixture comprising:
an annular ring having a vertically extending portion on an outer edge of the ring and adapted to receive the elastomer band; and
a base plate configured to be attached to the annular ring, the base plate having a plurality of radially extending portions adapted to receive a plurality of mechanical fasteners at locations corresponding to mounting holes in the semiconductor substrate support, and the base plate including an outer recess on an upper surface of the base plate configured to receive a lower surface of the annular ring.

2. The installation fixture of claim 1, comprising:
an annular recess on an inner portion of an upper surface of the annular ring.

3. The installation fixture of claim 2, wherein the annular recess is adapted to be located above an upper surface of the semiconductor substrate support.

4. The installation fixture of claim 1, wherein the base plate has an inner recess on a lower surface of the base plate, and wherein the inner recess is adapted to be located above an upper surface of the semiconductor substrate support.

5. The installation fixture of claim 1, wherein the base plate includes a plurality of holes each configured to receive a fastener, which attaches the base plate to the annular ring.

6. The installation fixture of claim 1, wherein the vertically extending portion has an angled tip at a free end thereof.

7. The installation fixture of claim 1, wherein the base plate has a generally annular outer diameter.

8. The installation fixture of claim 1, wherein the annular ring is made of polytetrafluoroethylene (PTFE) and the base plate is made of polyethylene terephthalate (PET).

9. An elastomer band installation kit, the kit comprising:
an installation fixture adapted to mount an elastomer band in a mounting groove around a semiconductor substrate support used for supporting a semiconductor substrate in a plasma processing chamber, the installation fixture comprising:
an annular ring having a vertically extending portion on an outer edge of the ring and adapted to receive the elastomer band; and
a base plate configured to be attached to the annular ring, the base plate having a plurality of radially extending portions with through-holes adapted to receive a plurality of mechanical fasteners at locations corresponding to mounting holes in the semiconductor substrate support, the base plate including an outer recess on an upper surface of the base plate configured to receive a lower surface of the annular ring; and
a plurality of mechanical fasteners each adapted to fit through the mounting holes of the substrate support and through the through-holes of the installation fixture.

10. The kit of claim 9, comprising:
an annular recess on an inner portion of an upper surface of the annular ring.

11. The kit of claim 10, wherein the annular recess is adapted to be located above an upper surface of the semiconductor substrate support.

12. The kit of claim 9, wherein the base plate has an inner recess on a lower surface of the base plate, and wherein the inner recess is adapted to be located above an upper surface of the semiconductor substrate support.

13. The kit of claim 9, wherein the base plate includes a plurality of holes each configured to receive a fastener, which attaches the base plate to the annular ring.

14. The kit of claim 9, wherein the vertically extending portion has an angled tip at a free end thereof.

15. The kit of claim 9, wherein the base plate has a generally annular outer diameter.

16. The kit of claim 9, wherein the annular ring is made of polytetrafluoroethylene (PTFE) and the base plate is made of polyethylene terephthalate (PET).

17. The kit of claim 9, comprising:
a protective cover configured to fit around and over the vertical extending portion and the outer edge of the annular ring.

18. A method of installing an elastomer band as a protective edge seal around a portion of a semiconductor substrate support used for supporting a semiconductor substrate in a plasma processing chamber, the method comprising:
disposing an elastomer band around a vertically extending portion of an installation fixture, the installation fixture comprising:
an annular ring having a vertically extending portion on an outer edge of the ring and adapted to receive the elastomer band; and
a base plate attached to the annular ring, the base plate having a plurality of radially extending portions and a plurality of mechanical fasteners in mounting holes in the semiconductor substrate support, the base plate including an outer recess on an upper surface of the base plate configured to receive a lower surface of the annular ring; and sliding the elastomer band off the vertically extending portion of the installation fixture and into a mounting groove in the substrate support adapted to receive the elastomer band.

* * * * *